(12) United States Patent
Lee et al.

(10) Patent No.: US 12,317,520 B2
(45) Date of Patent: May 27, 2025

(54) SEMICONDUCTOR DEVICE AND METHOD FOR FABRICATING THE SAME

(71) Applicant: SK hynix Inc., Gyeonggi-do (KR)

(72) Inventors: Lynn Lee, Gyeonggi-do (KR); Wan Joo Maeng, Gyeonggi-do (KR); Jae Hee Song, Gyeonggi-do (KR); Ki Vin Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/592,862

(22) Filed: Feb. 4, 2022

(65) Prior Publication Data
US 2022/0399435 A1  Dec. 15, 2022

(30) Foreign Application Priority Data
Jun. 11, 2021 (KR) .......................... 10-2021-0076035

(51) Int. Cl.
*H10D 1/68* (2025.01)
*H10D 1/00* (2025.01)

(52) U.S. Cl.
CPC ............. *H10D 1/696* (2025.01); *H10D 1/042* (2025.01); *H10D 1/043* (2025.01); *H10D 1/716* (2025.01)

(58) Field of Classification Search
CPC ......... H01L 28/75; H01L 28/91; H01L 28/92; H01L 28/40; H01L 23/642; H01L 28/56; H01L 28/60; H10D 1/696
See application file for complete search history.

(56) References Cited

U.S. PATENT DOCUMENTS

| | | | | |
|---|---|---|---|---|
| 6,075,691 A | * | 6/2000 | Duenas | H01L 21/02258 361/321.1 |
| 2019/0165088 A1 | * | 5/2019 | Cho | H01L 21/02672 |
| 2019/0355806 A1 | | 11/2019 | Kang et al. | |
| 2020/0058731 A1 | * | 2/2020 | Mun | H10B 12/03 |
| 2020/0091275 A1 | * | 3/2020 | Kim | H01L 28/40 |
| 2020/0395438 A1 | * | 12/2020 | Kang | H01L 28/56 |
| 2021/0125996 A1 | * | 4/2021 | An | H01L 28/90 |
| 2021/0134804 A1 | * | 5/2021 | Jung | H01L 28/75 |
| 2021/0273039 A1 | * | 9/2021 | Kim | H10B 12/315 |
| 2021/0384194 A1 | * | 12/2021 | Woo | H10B 12/318 |
| 2022/0037325 A1 | * | 2/2022 | Kang | H10B 12/30 |
| 2022/0208959 A1 | * | 6/2022 | Tsai | H10B 20/50 |
| 2022/0254870 A1 | * | 8/2022 | Lee | H01L 28/40 |
| 2022/0293720 A1 | * | 9/2022 | Yuan | H01G 4/005 |
| 2022/0344346 A1 | * | 10/2022 | Lee | H10B 12/033 |

FOREIGN PATENT DOCUMENTS

KR   10-2020-0114789 A   10/2020

OTHER PUBLICATIONS

Office Action for Korean Patent Application No. 10-2021-0076035 issued by the Korean Patent Office on Feb. 11, 2025.

* cited by examiner

*Primary Examiner* — Errol V Fernandes
(74) *Attorney, Agent, or Firm* — IP & T GROUP LLP

(57) ABSTRACT

The present invention relates to a semiconductor device having a capacitor and a method for fabricating the same. A semiconductor device may comprise: a lower electrode; a supporter supporting an outer wall of the lower electrode; a dielectric layer formed over the lower electrode and the supporter; an upper electrode formed on the dielectric layer; and a dielectric booster layer disposed between the lower electrode and the dielectric layer, and selectively formed on a surface of the lower electrode.

12 Claims, 15 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2021-0076035, filed on Jun. 11, 2021, which is incorporated herein by reference in its entirety.

BACKGROUND

1. Field

The present invention relates to a semiconductor device and, more particularly, to a semiconductor device having a capacitor and a method for fabricating the same.

2. Description of the Related Art

As the semiconductor device is being highly integrated, the patterns constituting the semiconductor device occupy less area and the distance among the patterns decreases.

For memory devices, it has been proposed to form supporters for supporting the storage node as the aspect ratio of the storage node (or lower electrode) of the capacitor increases.

SUMMARY

Various embodiments of the present invention provide a semiconductor device having a capacitor and a method for fabricating the same.

According to an embodiment of the present invention, a semiconductor device may comprise: a lower electrode; a supporter supporting an outer wall of the lower electrode; a dielectric layer formed over the lower electrode and the supporter; an upper electrode formed on the dielectric layer; and a dielectric booster layer disposed between the lower electrode and the dielectric layer, and selectively formed on a surface of the lower electrode.

According to an embodiment of the present invention, a method for fabricating a semiconductor device may comprise: forming a plurality of lower electrodes on an upper surface of a substrate and a supporter supporting the lower electrodes; forming a booster material layer over the lower electrodes and the supporter to be thinner on a surface of the lower electrodes than on a surface of the supporter; removing the booster material layer from the surface of the supporter to selectively form a booster layer on the surface of the lower electrodes; forming a dielectric layer over the booster layer, the lower electrodes, and the supporter; and forming an upper electrode over the dielectric layer.

According to an embodiment of the present invention, a semiconductor device may comprise: a lower electrode; a supporter supporting an outer wall of the lower electrode; a dielectric layer formed over the lower electrode and the supporter; an upper electrode formed on the dielectric layer; an interface layer formed between the dielectric layer and the upper electrode; and a dielectric booster layer disposed between the lower electrode and the dielectric layer, and selectively formed on a surface of the lower electrode.

According to an embodiment of the present invention, a semiconductor device may comprise: a lower electrode; a silicon nitride-based supporter supporting an outer wall of the lower electrode; a dielectric layer formed over the lower electrode and the silicon nitride-based supporter; an upper electrode formed on the dielectric layer; an niobium-based interface layer formed between the dielectric layer and the upper electrode; and a niobium-based booster layer disposed between the lower electrode and the dielectric layer, and selectively formed on a surface of the lower electrode.

According to an embodiment of the present invention, a semiconductor device, comprising: a capacitor structure including a plurality of lower electrodes electrically connected via a plurality of corresponding contact plugs to a substrate; at least one support layer for supporting the plurality of the lower electrode layers; a plurality of upper electrodes corresponding to the plurality of the lower electrodes; a dielectric layer formed between the upper and the lower electrodes; and a booster layer disposed selectively between the dielectric layer and the lower electrode.

The present invention may selectively form a booster layer on a surface of lower electrodes through selective deposition and etching of booster materials. Therefore, the effective oxide thickness may be decreased.

The present invention may further increase a capacitor capacitance as the boost layer amplifies the dielectric layer's dielectric constant.

These and other features of the present invention will become better understood from the following figures and detailed description.

DETAILED DESCRIPTION

Figure 1:
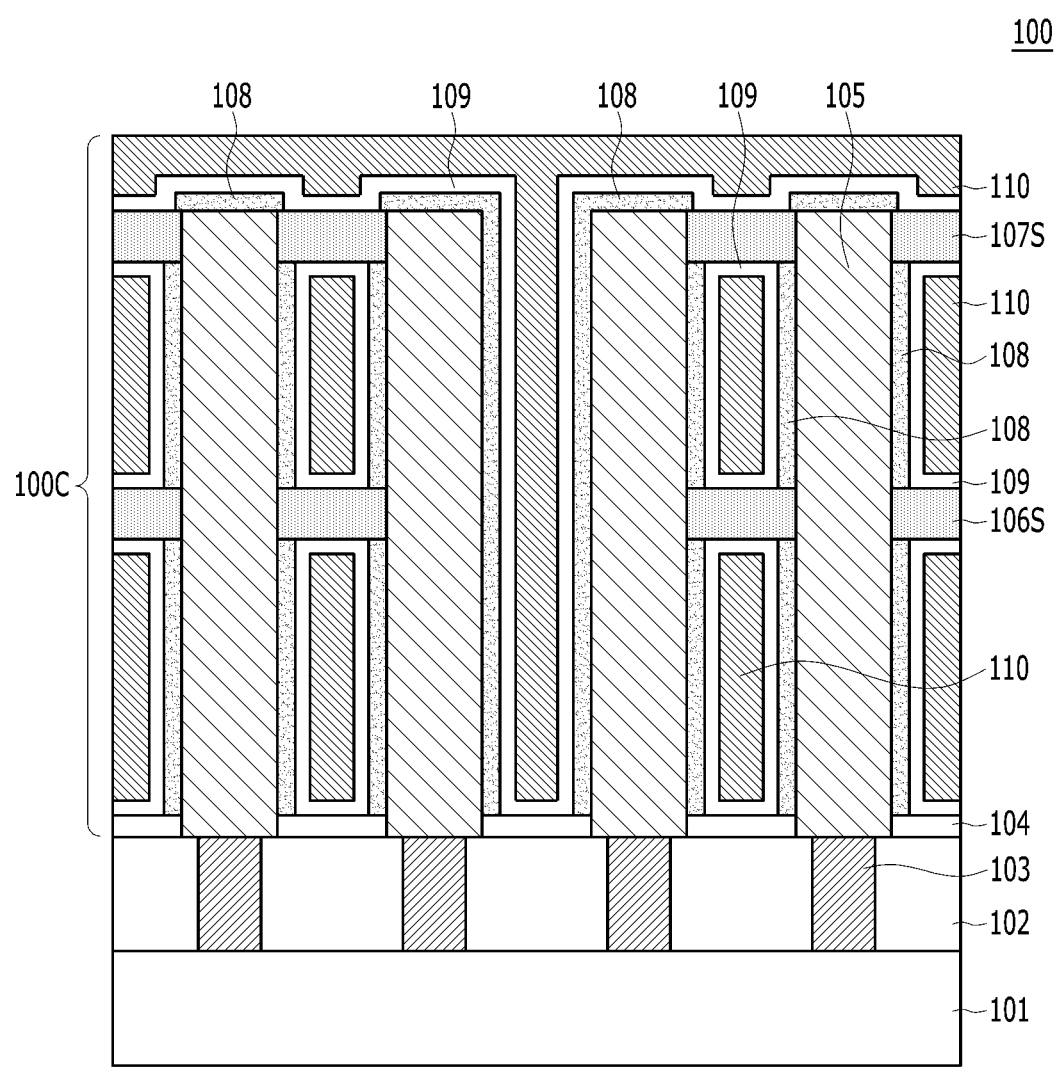
FIG. 1 is a diagram illustrating a semiconductor device according to an embodiment of the present invention.

Various embodiments described herein will be described with reference to cross-sectional views, plane views and block diagrams, which are ideal schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings are intended to illustrate specific examples of structures of regions of the various elements, and are not intended to limit the scope of the invention.

FIG. 1 is a diagram illustrating a semiconductor device according to an embodiment of the present invention.

Referring to FIG. 1, a semiconductor device 100 may include a substrate 101 and a capacitor structure 100C formed on the substrate 101. The capacitor structure 100C may include a plurality of lower electrodes 105, supports 106S and 107S for supporting the lower electrodes 105, a dielectric layer 109 formed over the lower electrodes 105 and the supporters 106S and 107S, and an upper electrode 110 formed over the dielectric layer 109. The capacitor structure 100C may further include a booster layer 108 formed between the lower electrodes 105 and the dielectric layer 109. Each of the lower electrodes 105 may electrically connect to the substrate 101 through a corresponding contact plug 103. The contact plugs 103 may connect to the substrate 101 by penetrating through an interlayer insulating layer 102 formed over the substrate 101. The contact plugs 103 may be referred to as "storage node contact plugs."

The substrate 101 may include a material suitable for semiconductor processing. For example, the substrate 101 may include a semiconductor substrate, and the semiconductor substrate may include a silicon-containing material. Examples of suitable silicon-containing materials for the semiconductor substrate may include silicon, monocrystalline silicon, polysilicon, amorphous silicon, silicon germanium, monocrystalline silicon germanium, polycrystalline silicon germanium, carbon-doped silicon, or any combination thereof. The semiconductor substrate may include other semiconductor materials such as germanium. The semiconductor substrate may include a III/V group semiconductor substrate, for example, a compound semiconductor substrate such as GaAs. The semiconductor substrate may include a silicon on insulator (SOI) substrate. The substrate may be formed as a single layer or a multi-layer.

An etch stop layer 104 may be formed over the interlayer insulating layer 102. A bottom surface of each of the lower electrodes 105 may connect to the corresponding contact plug 103 by penetrating through an etch stop layer 104. An outer wall of the lower electrodes 105 may be supported by the supporters 106S and 107S. The supporters 106S and 107S may each have a plate-like structure laterally extending between neighboring lower electrodes 105 for supporting the neighboring lower electrodes. Although, lower-level and upper-level supporters 106S and 107S are shown in the embodiment of FIG. 1, it should be understood that single-level supporters may also be used. Also, the supporters may include multi-level dielectric supporters. The upper-level and lower-level supporters 107S and 106S may be positioned at a higher and a lower level relatively to each other. The upper-level supporter 107S and the lower-level supporter 106S may support an outer wall of the lower electrodes 105. The lower-level supporter 106S may be vertically spaced apart from the upper-level supporter 107S. The upper-level supporter 107S may be thicker than the lower-level supporter 106S. A distance between the upper-level supporter 107S and the lower-level supporter 106S may be smaller than a distance between the lower-level supporter 106S and the etch stop layer 104. From the top view, the upper-level supporter 107S and the lower-level supporter 106S may have a plate-like structure. The upper-level supporter 107S and the lower-level supporter 106S may be formed of the same material or different materials. The upper-level supporter 107S and the lower-level supporter 106S may be formed of a nitride-based material. Examples of suitable nitride-based materials for the upper-level supporter 107S and the lower-level supporter 106S may include silicon nitride, silicon carbon nitride, silicon boron nitride and any combination thereof. The lower electrodes 105 and the supporters 106S and 107S may directly contact each other.

Suitable materials for the lower electrodes 105 may include polysilicon or a metal-based material. Examples of suitable metal-based materials for the lower electrodes may include a metal, a metal nitride, a metal silicon nitride, a conductive metal oxide, a metal silicide, a noble metal, or a combination thereof. The lower electrodes 105 may at least include one selected from the group consisting of titanium (Ti), titanium nitride (TiN), titanium silicon nitride (TiSiN), tantalum (Ta), tantalum nitride (TaN), titanium aluminum nitride (TiAlN), tungsten (W), tungsten nitride, (WN), ruthenium (Ru), ruthenium oxide (RuO$_2$), iridium (Ir), iridium oxide (IrO$_2$), platinum (Pt), molybdenum (Mo), or a combination thereof.

The dielectric layer 109 may include a high-k material having a higher dielectric constant than silicon oxide. Examples of suitable high-k materials for the dielectric layer 109 may include hafnium oxide (HfO$_2$), zirconium oxide (ZrO$_2$), aluminum oxide (Al$_2$O$_3$), titanium oxide (TiO$_2$), tantalum oxide (Ta$_2$O$_5$), niobium oxide (Nb$_2$O$_5$) or strontium titanium oxide (SrTiO$_3$). In another embodiment, the dielectric layer 109 may be formed of a composite layer including two or more layers of the aforementioned high-k materials. In this embodiment, the dielectric layer 109 may be formed of a zirconium oxide-based material having good leakage current characteristics while sufficiently decreasing the equivalent oxide thickness (EOT). For example, the dielectric layer 109 may include a ZAZ (ZrO$_2$/Al$_2$O$_3$/ZrO$_2$) stack, a ZAZA (ZrO$_2$/Al$_2$O$_3$/ZrO$_2$/Al$_2$O$_3$) stack, or a ZAZAT (ZrO$_2$/Al$_2$O$_3$/ZrO$_2$/Al$_2$O$_3$/TiO$_2$) stack. In another embodiment, the dielectric layer 109 may include a HAH (HfO$_2$/Al$_2$O$_3$/HfO$_2$) stack, a TiO$_2$/ZrO$_2$/Al$_2$O$_3$/ZrO$_2$ stack, a TiO$_2$/HfO$_2$/Al$_2$O$_3$/HfO$_2$ stack, a Ta$_2$O$_5$/ZrO$_2$/Al$_2$O$_3$/ZrO$_2$ stack, or a Ta$_2$O$_5$/HfO$_2$/Al$_2$O$_3$/HfO$_2$ stack. In another embodiment, the dielectric layer 109 may include hafnium oxide having a tetragonal crystalline phase. In another embodiment, the dielectric layer 109 may include a HZAZH (HfO$_2$/ZrO$_2$/Al$_2$O$_3$/ZrO$_2$/HfO$_2$) stack. In another embodiment, the dielectric layer 109 may include a ferroelectric material, an anti-ferroelectric material, or a combination thereof. In yet another embodiment, the dielectric layer 109 may include HfZrO, Hf-rich HfZrO, Zr-rich HfZrO, or a combination thereof.

The upper electrode 110 may include polysilicon, silicon germanium, a metal, metal nitride, metal silicon nitride, metal silicide, a noble metal, or a combination thereof. The upper electrode 110 may include at least one selected from the group consisting of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide (RuO$_2$), iridium (Ir), iridium oxide (IrO$_2$), platinum (Pt), molybdenum (Mo), or a combination thereof. For example, the upper electrode 110 may be formed by sequentially stacking titanium nitride (TiN), silicon germanium (SiGe), and tungsten nitride (WN) in the recited order.

The booster layer 108 may be selectively formed on an outer wall of the lower electrodes 105. In other words, the booster layer 108 may not be formed either between the upper-level supporter 107S and the dielectric layer 109 and between the lower-level supporter 106S and the dielectric layer 109. The area between the lower electrodes 105 and the supporters 106S and 107S may have a booster-free structure in which the booster layer 108 is not disposed. The booster layer 108 may be selectively formed on the upper surface of the lower electrodes 105. The booster layer 108 may be extended to form on some surfaces of the supporters 106S and 107S. In other words, the booster layer 108 may not be formed on most surfaces of the supporters 106S and 107S, and may partially cover a contact area between the supporters 106S and 107S and the lower electrodes 105. The booster layer 108 may not be formed on surfaces of the supporters 106S and 107S. The booster layer 108 may be an insulating material.

The booster layer 108 may serve a role of boosting the dielectric constant of the dielectric layer 109. In other words, the booster layer 108 may be used as a dielectric constant booster. For example, the dielectric layer 109 alone may have a dielectric constant of 60, while the dielectric layer 109 which is contacting the booster layer 108 may have a dielectric constant of more than 60. Generally, the booster layer 108 serves as a polarization enhancement layer strengthening the polarization of the dielectric layer 109, thus increasing the dielectric constant of the dielectric layer 109.

The booster layer 108 and the dielectric layer 109 may be formed of different materials. The booster layer 108 may include a first high-k material and the dielectric layer 109 may include a second high-k material, wherein the first and second high-k materials may be different. In another embodiment, the dielectric layer 109 may include a first metal, and the booster layer 108 may include a second metal. The first metal and the second metal may be different. The first metal may include at least one selected from the group consisting of hafnium, zirconium, aluminum, and titanium. The second metal may include niobium, tantalum, yttrium, or lanthanum. In another embodiment, the dielectric layer 109 may include a first metal oxide, and the booster layer 108 may include a second metal oxide. In another embodiment, the dielectric layer 109 may include the first metal oxide, and the booster layer 108 may include second metal oxynitride. The dielectric layer 109 may include hafnium oxide, zirconium oxide, aluminum oxide, titanium oxide, or a combination thereof. The booster layer 108 may be a niobium-based material. The booster layer 108 may include niobium oxide ($Nb_2O_5$), niobium nitride (NbN), or niobium oxynitride (NbON). The niobium nitride (NbN) used as the booster layer 108 may be dielectric, and the dielectric niobium nitride may include nitrogen-rich niobium nitride. In another embodiment, the booster layer 108 may include high-k materials such as tantalum oxide, yttrium oxide, or lanthanum oxide.

In another embodiment, the dielectric layer 109 may include a high-k material having a tetragonal crystalline structure. Hereinafter, a high-k material having a tetragonal crystalline structure will be abbreviated as a tetragonal high-k material. The tetragonal high-k material may have a higher dielectric constant than a non-tetragonal high-k material. The non-tetragonal high-k material may have crystal structures such as amorphous or monoclinic systems.

The tetragonal high-k material may include tetragonal hafnium oxide. The tetragonal hafnium oxide may have a dielectric constant of about 60. The dielectric layer 109 may include tetragonal hafnium oxide having an increased dielectric constant. That is, the dielectric constant of the tetragonal hafnium oxide may be increased by the booster layer 108. For example, when the tetragonal hafnium oxide has a dielectric constant of about 60, the dielectric constant of the tetragonal hafnium oxide in contact with the booster layer 108 may become more than 60. Due to the booster layer 108, the tetragonal hafnium oxide may have a dominant tetragonal crystal structure. The tetragonal crystal structure of the tetragonal hafnium oxide may be promoted by using the booster layer 108 as a crystallization promoting layer. Hafnium oxide having a tetragonal crystal structure may have a higher dielectric constant than hafnium oxide having a monoclinic crystal structure, and accordingly, the capacitor structure 100C may have a relatively larger capacitance.

The dielectric layer 109 may have a higher dielectric constant by having a tetragonal crystal structure. Also, the dielectric constant may be further increased by the booster layer 108.

FIGS. 2A to 2H are diagrams illustrating a method for fabricating a semiconductor device according to an embodiment of the present invention.

Figure 2A:
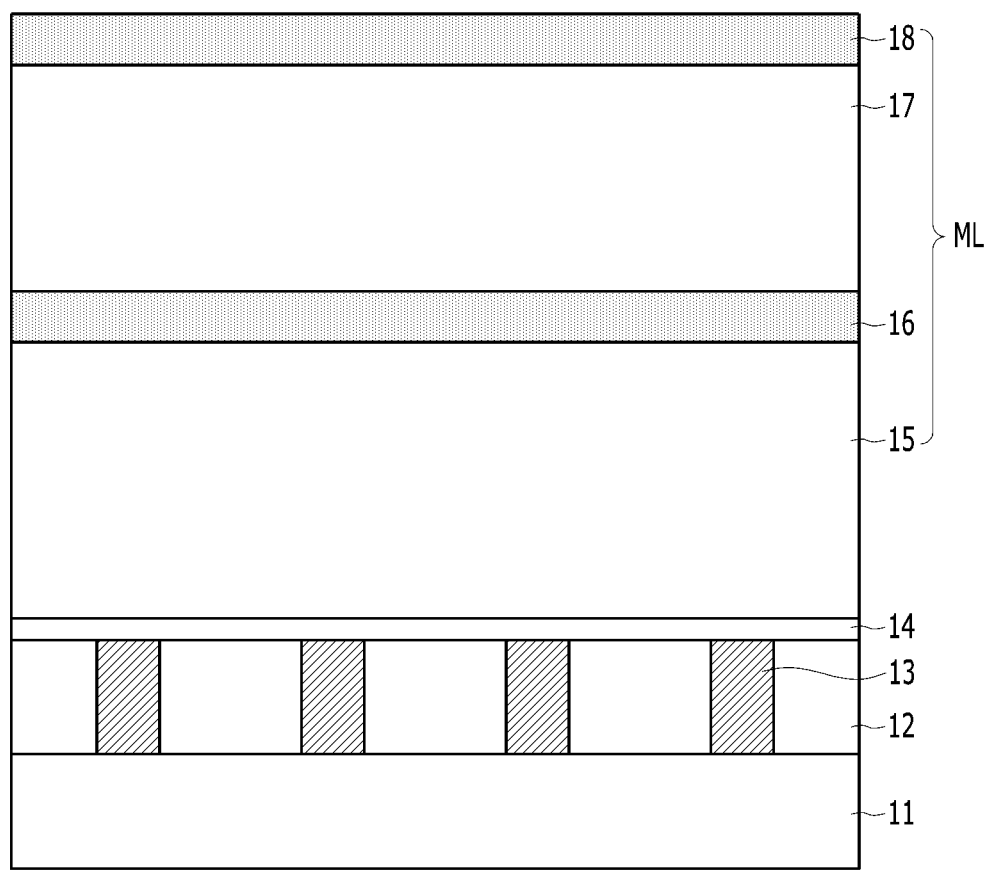
FIGS. 2A to 2H are diagrams illustrating a method for fabricating a semiconductor device according to an embodiment of the present invention.

As shown in FIG. 2A, an interlayer insulating layer 12 may be formed on the substrate 11. The substrate 11 may include a material suitable for semiconductor processing. For example, the substrate 11 may include a semiconductor substrate, and the semiconductor substrate may include a silicon-containing material. Examples of suitable silicon-containing materials for the semiconductor substrate may include silicon, monocrystalline silicon, polysilicon, amorphous silicon, silicon germanium, monocrystalline silicon germanium, polycrystalline silicon germanium, carbon-doped silicon, or any combination thereof. The semiconductor substrate may include other semiconductor materials such as germanium. The semiconductor substrate may include a III/V group semiconductor substrate, for example, a compound semiconductor substrate such as GaAs. The semiconductor substrate may include a silicon on insulator (SOI) substrate. The substrate may be formed as a single layer or a multi-layer.

The interlayer insulating layer 12 may include at least one of silicon oxide, silicon nitride, and silicon oxynitride.

Contact plugs 13 may be formed in the interlayer insulating layer 12. The contact plugs 13 may pass through the interlayer insulating layer 12 to be electrically connected to a portion of the substrate 11. The contact plugs 13 may include a semiconductor material, a metal, a metal nitride, a metal silicide, or a combination thereof. For example, the contact plugs 13 may include polysilicon, tungsten, tungsten nitride, titanium nitride, titanium silicon nitride, titanium silicide, cobalt silicide, or a combination thereof. In another embodiment, the contact plugs 13 may include a stack of a semiconductor material, a metal silicide, a metal nitride, and a metal which are sequentially stacked in the recited order.

A plurality of word lines and bit lines may be formed on and/or in the substrate 11. The interlayer insulating layer 12 may be formed to cover the word lines and the bit lines. Impurity regions may be formed in the substrate 11 on both sides of each of the word lines, and the contact plugs 13 may be connected to the impurity regions.

An etch stop layer 14 may be formed on the interlayer insulating layer 12 and the contact plugs 13, and a mold structure ML may be formed on the etch stop layer 14. The etch stop layer 14 may include silicon nitride. The mold structure ML may be a stack structure including different insulating materials. For example, the mold structure ML may include a stack of a first mold layer 15, a first support layer 16, a second mold layer 17, and a second support layer 18 which are sequentially stacked in the recited order on the etch stop layer 14. The first support layer 16 and the second support layer 18 may include a material having an etch selectivity with respect to the first and second mold layers 15 and 17. The first support layer 16 and the second support layer 18 may include a silicon nitride-based material. For example, the first mold layer 15 and the second mold layer 17 may include silicon oxide, and the first support layer 16 and the second support layer 18 may include silicon nitride. In another embodiment, the first support layer 16 and the second support layer 18 may include silicon carbon nitride or silicon boron nitride. In yet another embodiment, the first support layer 16 and the second support layer 18 may include a stack of silicon nitride and silicon carbon nitride or a stack of silicon nitride and silicon boron nitride.

Figure 2B:
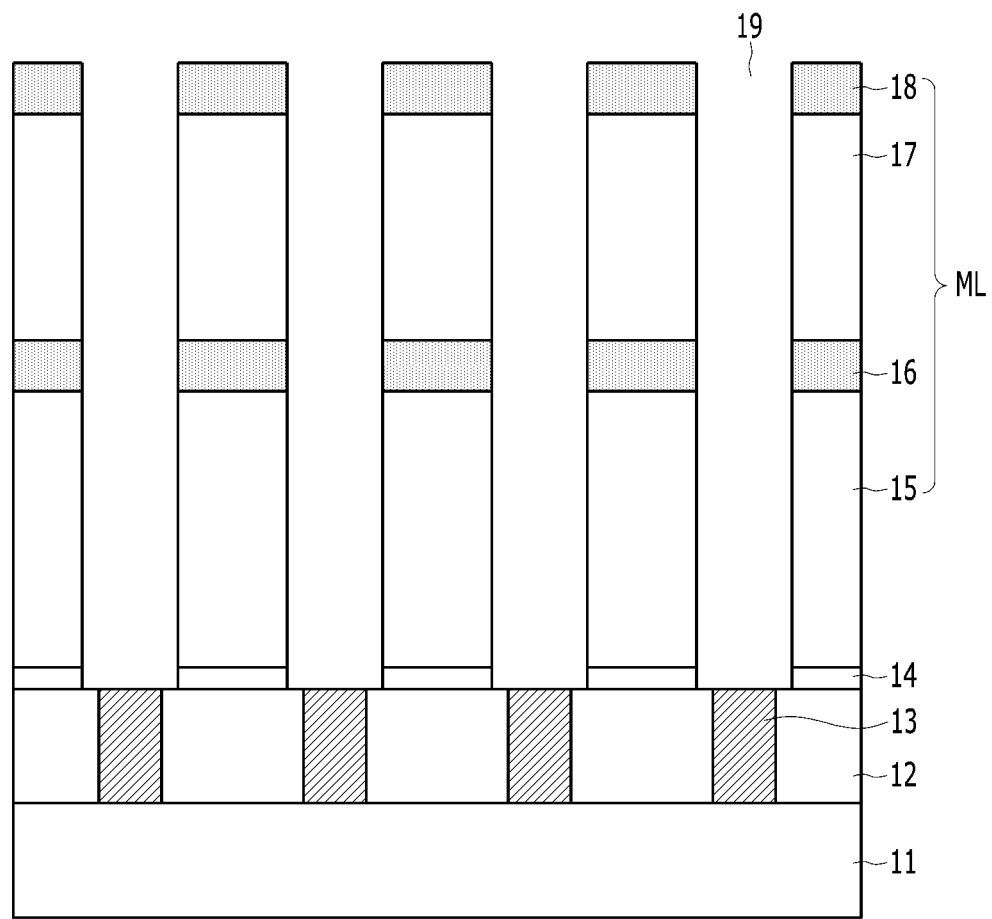

As shown in FIG. 2B, a plurality of openings 19 may be formed in the mold structure ML. The openings 19 may be formed by etching the mold structure ML using a mask layer.

The second support layer 18, the second mold layer 17, the first support layer 16, and the first mold layer 15 may be sequentially etched to form the openings 19. The etching process for forming the openings 19 may stop at the etch stop layer 14. Dry etching, wet etching, or a combination thereof may be used to form the openings 19. The openings 19 may be referred to as holes in which lower electrodes (or storage nodes) are to be formed.

Subsequently, the etch stop layer 14 may be etched to expose the top surface of each of the contact plugs 13 disposed under the openings 19.

The openings 19 may be formed by a double patterning process. For example, the mask layer for forming the openings 19 may have a mesh-shape formed by combining two spacer patterning techniques.

Figure 2C:
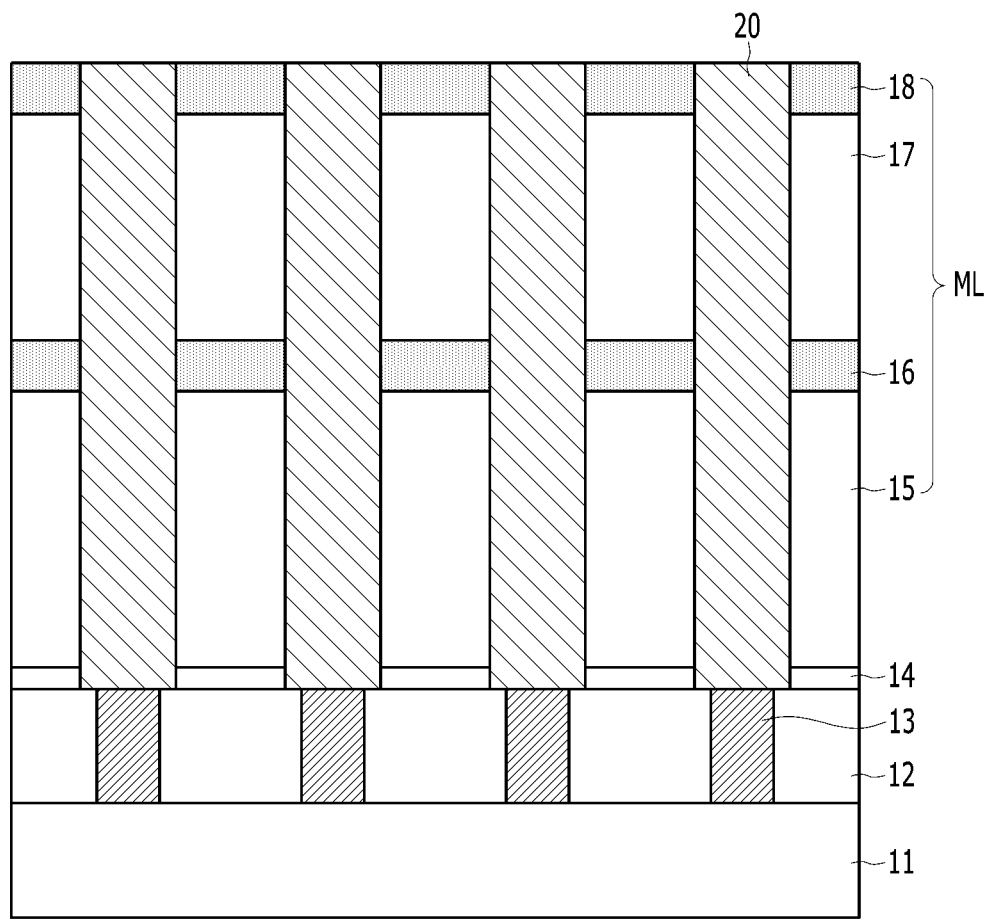

As shown in FIG. 2C, a lower electrode 20 may be formed in each of the openings 19. The lower electrodes 20 may fill the inside of the openings 19. The lower electrodes 20 may have a pillar-shape. To form the pillar-shape lower electrodes 20, a planarization process may be performed after depositing a conductive material gap-filling the openings 19. The lower electrodes 20 may include polysilicon or a metal-based material. The metal-based material may include a metal, a metal nitride, a metal silicon nitride, a conductive metal oxide, a metal silicide, a noble metal, or a combination thereof. The lower electrodes 20 may include titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof. The lower electrodes 20 may include titanium nitride (TiN). The lower electrodes 20 may include titanium nitride (ALD-TiN) formed by atomic layer deposition (ALD). In another embodiment, the lower electrodes 20 may include a stack of a cylindrical electrode and a pillar-shape electrode. For example, the cylindrical electrode may be titanium nitride, and the pillar-shape electrode may be polysilicon.

Figure 2D:
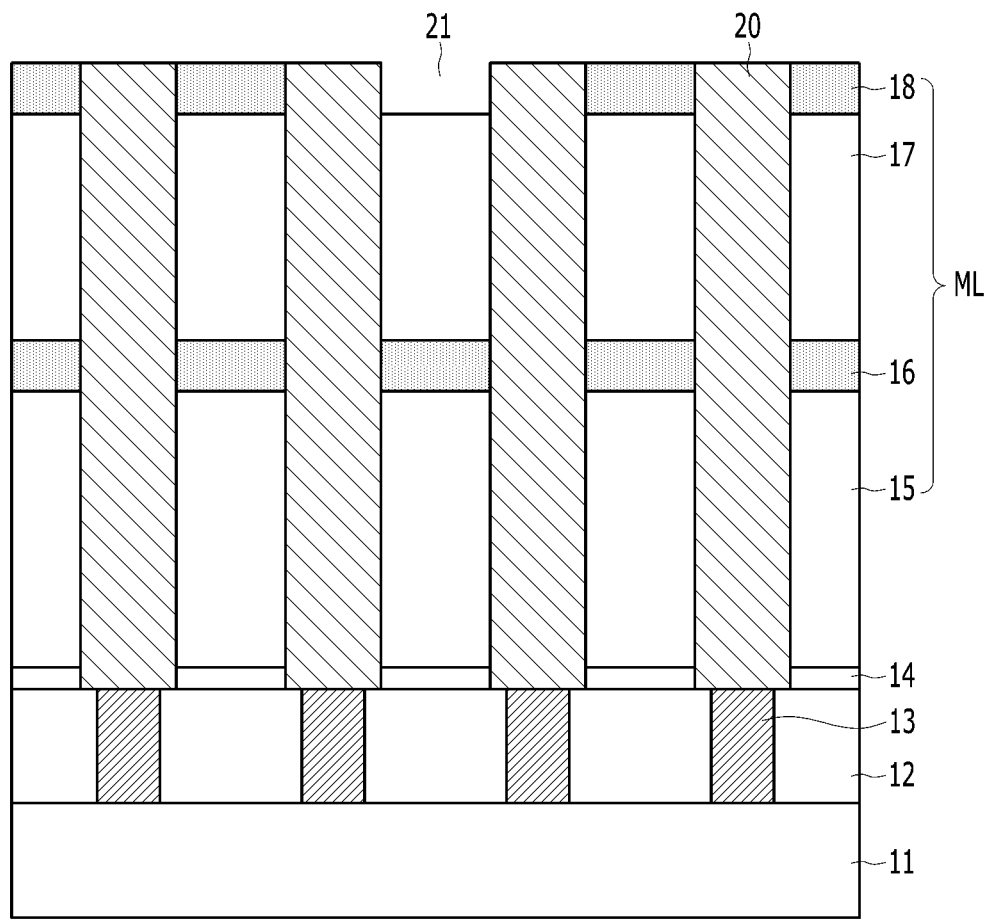

As shown in FIG. 2D, a portion of the second support layer 18 may be etched. The upper-level supporter opening 21 and the upper-level supporter 18S may be formed by etching the second support layer 18. The upper-level supporter 18S may be a plate-shaped supporter. The upper-level supporter 18S may contact upper outer walls of the lower electrodes 20. Some surfaces of the second mold layer 17 may be exposed by the upper-level supporter opening 21 and the upper-level supporter 18S. The upper-level supporter 18S may have a shape that partially surrounds the outer walls of the lower electrodes 20. The upper-level supporter 18S may prevent the lower electrodes 20 from collapsing in a subsequent removal process of the second mold layer 17.

When viewed from top, the upper-level supporter opening 21 may have a shape that partially exposes outer walls of three adjacent lower electrodes 20. In another embodiment, the upper-level supporter opening 21 may have a shape that partially exposes outer walls of at least four or more lower electrodes 20. The upper-level supporter opening 21 may have a cross-sectional surface of a triangular, quadrangular, parallelogram, pentagonal, hexagonal or honeycomb shape.

The outer walls of all the lower electrodes 20 may be partially exposed by the upper-level supporter opening 21. This may be referred to as an 'all open lower electrode array.'

In another embodiment, the upper outer walls of the at least one lower electrode 20 may not be exposed by being covered by the upper-level supporter opening 21. For example, among the plurality of the lower electrodes 20, at least one lower electrode 20 not exposed by the upper-level supporter opening 21 and fully covered by the upper-level supporter 18S may exist. Such a lower electrode 20 may be referred to as a '1 span lower electrode array.'

Figure 2E:
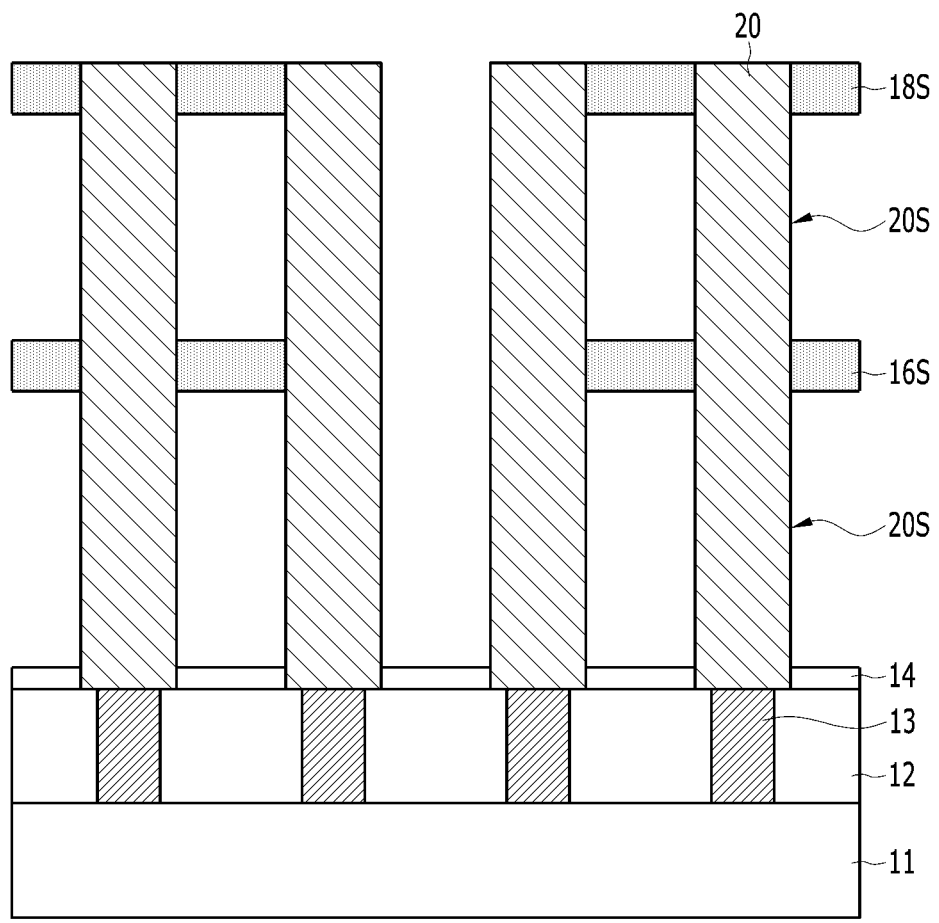

As shown in FIG. 2E, the second mold layer 17 under the upper-level supporter opening 21 may be removed. The second mold layer 17 may be removed by a wet dip-out process. The second mold layer 17 may be selectively removed, and thus the surface of the first support layer 16 may be exposed. The wet dip-out process for removing the second mold layer 17 may be performed using an etching solution capable of selectively removing the second mold layer 17. When the second mold layer 17 includes silicon oxide, the second mold layer 17 may be removed by wet etching using hydrofluoric acid (HF).

After the second mold layer 17 is removed, a lower-level supporter 16S may be formed by etching the first support layer 16. The lower-level supporter 16S may contact the outer walls of the lower electrodes 20. Some surfaces of the first mold layer 15 may be exposed by the lower-level supporter 16S. The lower-level supporter 16S may have a shape that partially surrounds the outer walls of the lower electrodes 20. The lower-level supporter 16S may prevent the lower electrodes 20 from collapsing in a subsequent process of removing the first mold layer 15. The lower-level supporter 16S and the upper-level supporter 18S may have the same shape.

Subsequently, the first mold layer 15 may be removed. The first mold layer 15 may be removed by a wet dip-out process. The first mold layer 15 may be selectively removed, and thus the surface of the etch stop layer 14 may be exposed. The wet dip-out process for removing the first mold layer 15 may be performed using an etching solution capable of selectively removing the first mold layer 15. When the first mold layer 15 includes silicon oxide, the first mold layer 15 may be removed by wet etching using hydrofluoric acid (HF).

The lower-level supporter 16S and the upper-level supporter 18S supporting the outer walls of the lower electrodes 20 may be formed by a series of processes as described above with reference to FIGS. 2B to 2E. The outer wall 20S of the lower electrodes 20 may be partially exposed between the lower-level supporter 16S and the upper-level supporter 18S. Also, the outer wall 20S of the lower electrodes 20 may be partially exposed between the lower-level supporter 16S and the etch stop layer 14.

Figure 2F:
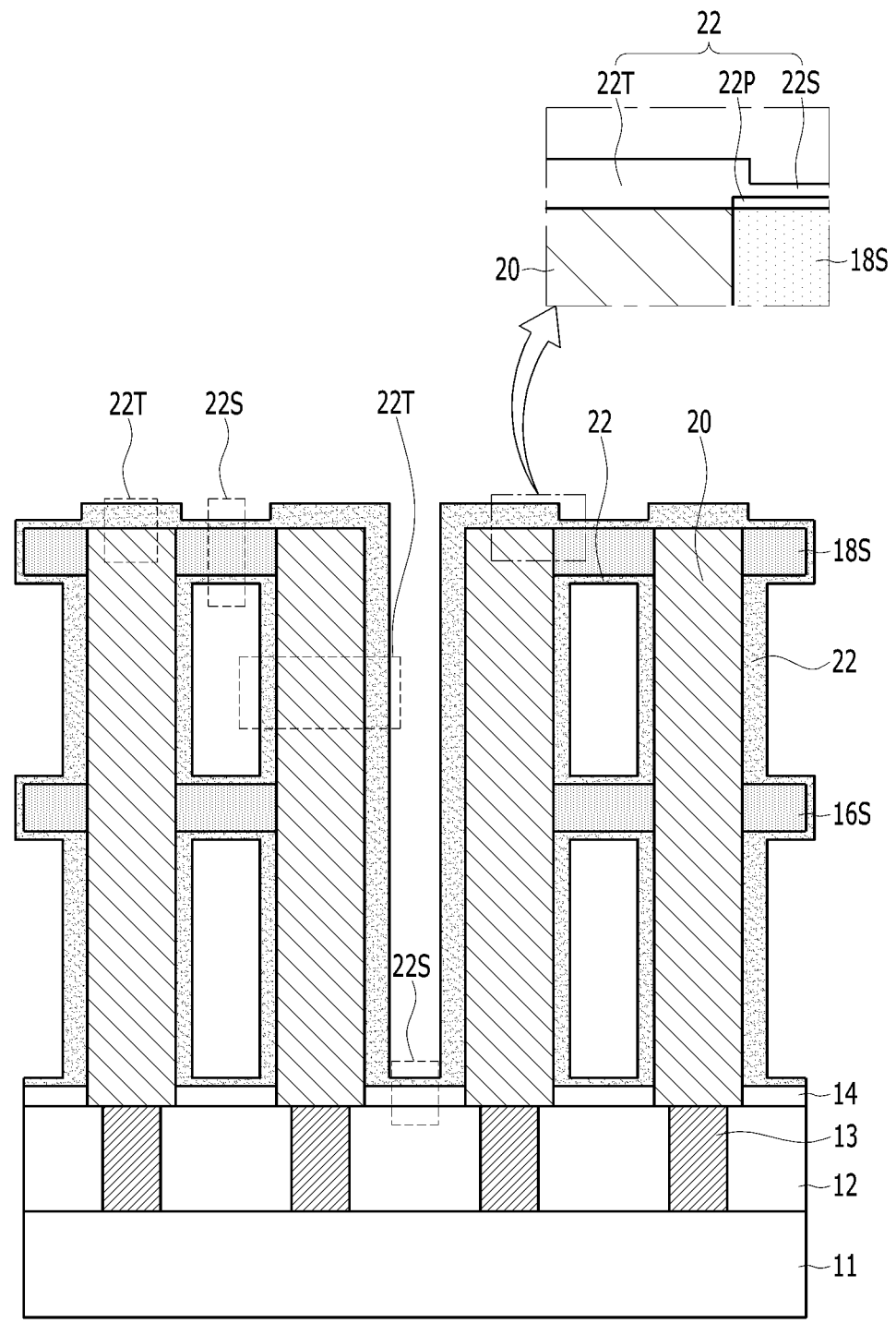

As shown in FIG. 2F, a booster material layer 22 may be selectively formed on the surfaces of the upper-level supporter 18S and the lower-level supporter 16S. The booster material layer 22 may be formed by a selective deposition method. The booster material layer 22 may include surface passivation materials 22P, first portions 22S, and second portions 22T. For example, the first portions 22S may be formed on the surfaces of the etch stop layer 14, the upper-level supporter 18S, and the lower-level supporter 16S. The first portions 22S may be formed over the surfaces of the lower electrodes 20. The first portions 22S may be thinner than the second portions 22T, and a thickness difference between the first portions 22S and the second portions 22T may be induced by the surface passivation material 22P. The surface passivation material 22P may contact the first portions 22S and may not contact the second portions 22T. The surface passivation material 22P may be selectively formed on the surfaces of the etch stop layer 14, the upper-level supporter 18S, and the lower-level supporter 16S. The surface passivation material 22P may be formed before the first portions 22S and the second portions 22T.

As described above, the booster material layer 22 may be selectively formed thinner on the surfaces of the upper-level supporter 18S and the lower-level supporter 16S than on the surfaces of the lower electrodes 20. The booster material layer 22 may be selectively formed thinner on the surface of the etch stop layer 14 than on the surfaces of the lower electrodes 20. As such, thin booster material layer 22 may be selectively formed on the surface of the silicon nitride-based material, or thick booster material layer 22 may be selectively formed on the surface of the polysilicon or metal-based material.

In order to form the booster material layer 22 having different thicknesses in the first portions 22S and the second portions 22T, the selective deposition of the booster material layer 22 may include surface passivation treatment. When the surface passivation treatment is performed, the surfaces of the etch stop layer 14, the upper-level supporter 18S, and the lower-level supporter 16S may be passivated first. Therefore, the booster material layer 22 may be prevented from being excessively adsorbed on the surfaces of the etch stop layer 14, the upper-level supporter 18S, and the lower-level supporter 16S during a deposition process of the booster layer 22. The surface passivation treatment may include adsorption of the surface passivation material 22P. The surface passivation material 22P may be selectively adsorbed onto the surfaces of the etch stop layer 14, the upper-level supporter 18S, and the lower-level supporter 16S. The surface passivation material 22P may not be adsorbed on the surfaces of the lower electrodes 20.

The surface passivation treatment may be performed in situ in the deposition chamber of the booster material layer 22. The booster material layer 22 may be formed by chemical vapor deposition (CVD) or atomic layer deposition (ALD).

Figure 3:
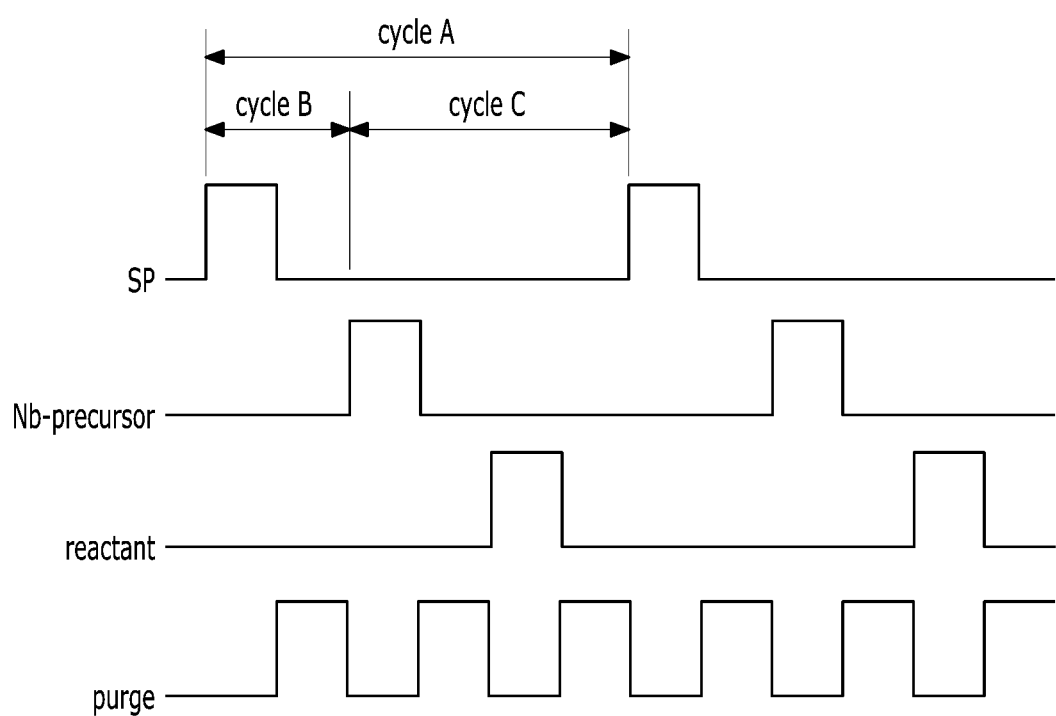
FIG. 3 is a gas supply timing diagram illustrating atomic layer deposition of a booster material layer according to an embodiment of the present invention.

FIG. 3 is a gas supply timing diagram illustrating atomic layer deposition of the booster material layer 22 according to an embodiment of the present invention. FIG. 3 illustrates the atomic layer deposition of niobium oxide.

Referring to FIG. 3, the atomic layer deposition of niobium oxide may repeat a first cycle (cycle A) several times. The first cycle (cycle A) may include a first sub-cycle (cycle B) and a second sub-cycle (cycle C). The first sub-cycle (cycle B) may include flowing a surface passivation material SP and purging, and the second sub-cycle (cycle C) may include flowing a niobium precursor (Nb-precursor), purging, flowing reactant gas, and purging. The first sub-cycle (cycle B) may be performed before the second sub-cycle (cycle C), and accordingly, the surface passivation material SP may be flowed before the niobium precursor (Nb-precursor) and the reactant gas. A surface passivation process may be performed by the first sub-cycle (cycle B), and niobium oxide may be deposited by the second sub-cycle (cycle C). Each of the first sub-cycle (cycle B) and the second sub-cycle (cycle C) may be repeated several times.

The surface passivation material SP may include an organic compound containing hydrogen or hydrocarbon. For example, an organic compound having a structure of X1-R1 (R2)n-R3 or R1(R2)n-X2-R3 may be used as the surface passivation material SP. R1 and R2 may be hydrogen (H) or a linear, branched, or cyclic hydrocarbon compound between C1 and C6. In this case, R1 and R2 may be the same or different from each other. R3 may be a linear hydrocarbon compound between C1 and C5. X1 and X2 may be $CH_2$ or a compound including O, S and NH. Also, X1 and X2 may be the same or different.

The niobium precursor may include an organometallic compound containing niobium. The niobium-containing organometallic compound may further include at least an alkyl group, an alkenyl group, a cycloalkyl group, a cycloalkenyl group, or an aryl group.

The purge gas may include an inert gas such as argon. As a reactant, $H_2O$, $O_3$ or $O_2$ may be used directly or simultaneously with plasma. In other embodiments, the reactant may use $N_2$ or $NH_3$ directly or simultaneously with plasma.

In another embodiment, the booster material layer 22 may include tantalum oxide, yttrium oxide, or lanthanum oxide. Tantalum oxide, yttrium oxide, and lanthanum oxide may be formed by atomic layer deposition as shown in FIG. 3. For example, atomic layer deposition of tantalum oxide may repeat a second cycle which includes flowing a surface passivation material SP, purging, flowing a tantalum precursor (Ta-precursor), purging, flowing reactant gas, and purging. Atomic layer deposition of yttrium oxide may repeat a third cycle which includes flowing a surface passivation material SP, purging, flowing an yttrium precursor (Y-precursor), purging, flowing reactant gas, and purging. Atomic layer deposition of lanthanum oxide may repeat a fourth cycle which includes flowing a surface passivation material SP, purging, flowing a lanthanum precursor (La-precursor), purging, flowing reactant gas, and purging.

In the chemical vapor deposition for forming the booster material layer 22, a surface passivation material may be first flowed, and then a source material and a reactant gas may be simultaneously supplied. Here, the source material may include a niobium precursor, a tantalum precursor, an yttrium precursor, or a lanthanum precursor.

Figure 2G:
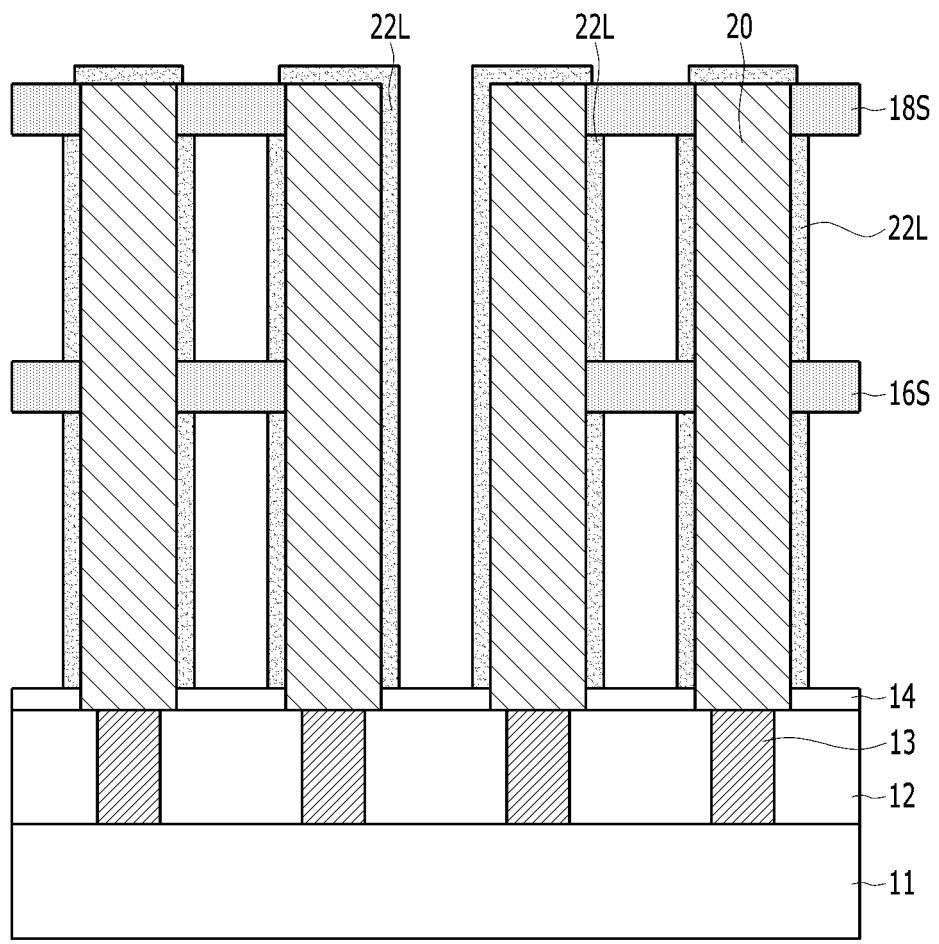

As shown in FIG. 2G, the booster material layer 22 may be selectively etched. Accordingly, the booster layer 22L may be formed on the surfaces of the lower electrodes 20. The booster layer 22L may not be formed on most parts of the surfaces of the upper-level supporter 18S and the lower-level supporter 16S.

To form the booster layer 22L, the booster material layer 22 may be subjected to vapor etching, for example, atomic layer etching (ALE). The ALE of the booster material layer 22 may use $NF_3$, $F_2$, or $ClF_3$. In another embodiment, the etching process for forming the booster layer 22L may use a plasma or thermal treatment. When the booster material layer 22 is subjected to the ALE, the second portions 22T may remain with a predetermined thickness even if all of the first portions 22S are etched. As a result, the booster layer 22L may be formed by the remaining portion of the second portions 22T of the booster material layer 22 of FIG. 2F. The booster layer 22L may be thinner than the second portions 22T of the booster material layer 22. Both the first portions 22S and the surface passivation materials SP may be removed by vapor etching of the booster material layer 22.

A vertical structure including a plurality of lower electrodes 20 and lower-level and upper-level supporters 16S and 18S supporting the lower electrodes 20 formed on the substrate 11 may be formed by a series of processes as described above. The vertical structure may include the booster layer 22L.

Figure 2H:
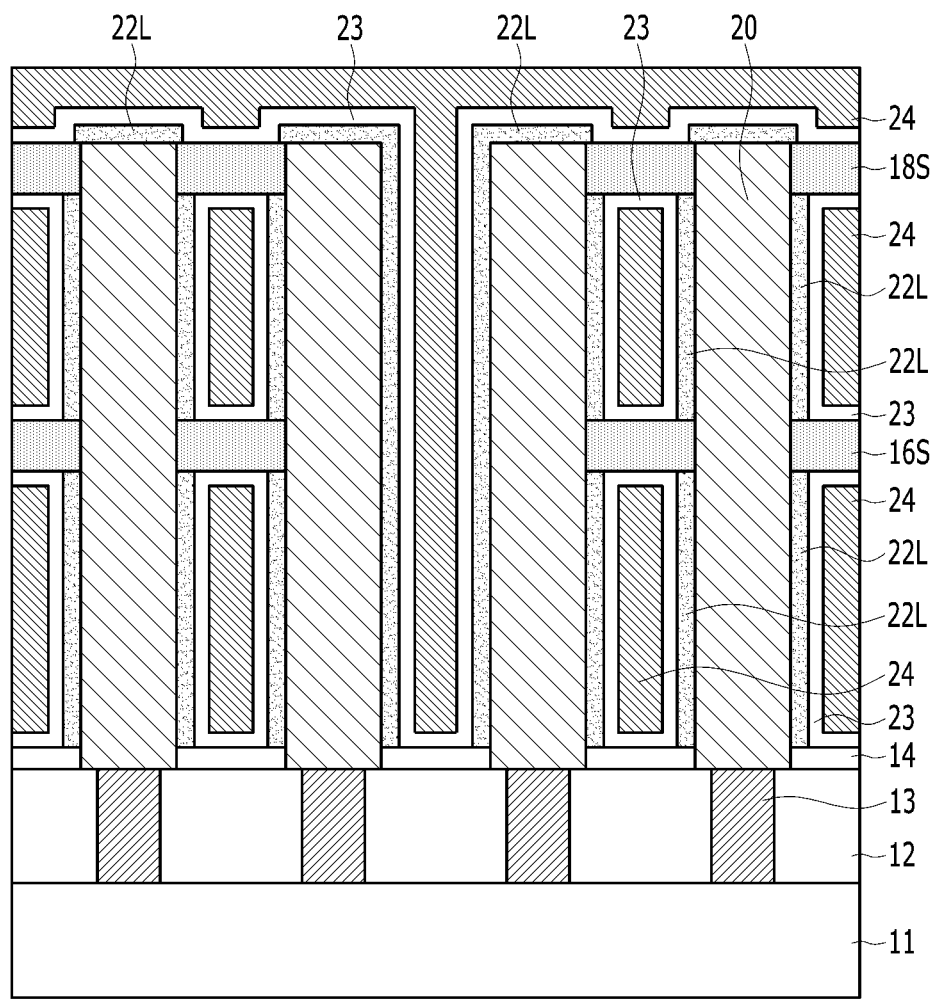

Subsequently, as shown in FIG. 2H, a dielectric layer 23 may be formed on the booster layer 22L and the supporters 16S and 18S, and upper electrode 24 may be formed on the dielectric layer 23.

The booster material layer 22 forming process, the booster layer 22L forming process, and the dielectric layer 23 forming process may be performed in situ. For example, these processes may be performed in situ within an atomic layer deposition chamber.

The dielectric layer 23 may include a high-k material having a higher dielectric constant than silicon oxide. High-k materials may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). In another embodiment, the dielectric layer 23 may be formed of a composite layer including two or more layers of the aforementioned high-k materials. In this embodiment, the dielectric layer 23 may be formed of a zirconium oxide-based material having good leakage current characteristics while sufficiently lowering the equivalent oxide thickness (EOT). For example, it may include a ZAZ ($ZrO_2/Al_2O_3/ZrO_2$) stack, a ZAZA ($ZrO_2/Al_2O_3/ZrO_2/Al_2O_3$) stack, or a ZAZAT ($ZrO_2/Al_2O_3/ZrO_2/Al_2O_3/TiO_2$) stack. In another embodiment, the dielectric layer 109 may include a HAH ($HfO_2/Al_2O_3/HfO_2$) stack, a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, or a $Ta_2O_5/HfO_2/Al_2O_3/HfO_2$ stack. In another embodiment, the dielectric layer 23 may include hafnium oxide having a tetragonal crystalline phase. In another embodiment, the dielectric layer 23 may include a HZAZH ($HfO_2/ZrO_2/Al_2O_3/ZrO_2/HfO_2$) stack. In another embodiment, the dielectric layer 23 may include a ferroelectric material, an anti-ferroelectric material, or a combination thereof. In another embodiment, the dielectric layer 23 may include HfZrO, Hf-rich HfZrO, Zr-rich HfZrO, or a combination thereof.

The dielectric layer 23 and the lower electrodes 20 may not contact each other because the booster layer 22L is disposed between the dielectric layer 23 and the lower electrodes 20. The outer walls of the lower electrodes 20 may be surrounded by the booster layer 22L. The booster layer 22L may extend vertically along sidewalls of the lower electrodes 20. The booster layer 22L may be formed between the dielectric layer 23 and the lower electrode 20, and the booster layer 22L may not be formed either between the dielectric layer 23 and the lower-level supporter 16S or between the dielectric layer 23 and the upper-level supporter 18S.

An upper electrode 24 may be formed on the dielectric layer 23. The upper electrode 24 may fill a space between the adjacent lower electrodes 20. The upper electrode 24 may extend to cover upper portions of the lower electrodes 20. The upper electrode 24 may include polysilicon, silicon germanium, metal, metal nitride, metal silicon nitride, conductive metal oxide, metal silicide, noble metal, or a combination thereof. The upper electrode 24 may include at least one selected from the group consisting of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof. For example, the upper electrode 24 may include a stack of titanium nitride (TiN), silicon germanium (SiGe), and tungsten nitride (WN) which are sequentially stacked in the recited order.

In another embodiment, the booster layer 22L may be applied even when only one of the upper-level supporter 18S or the lower-level supporter 16S is used as a single supporter.

In another embodiment, the booster layer 22L may be applied even when a multi-level supporter of at least three or more levels is applied.

According to the above-described embodiments, the booster layer 22L may be formed only on the surfaces of the lower electrodes 20 by selective deposition and selective etching of the booster material layer 22. Accordingly, the effective oxide thickness may decrease and the disturbance defect may be improved.

In addition, the step coverage of the dielectric layer 23 may be improved by selectively depositing and selectively etching the booster material layer 22.

In Comparative Example 1, the surface passivation treatment may be omitted when the booster material layer 22 is deposited. This is abbreviated as non-selective deposition of the booster material layer 22. In Comparative Example 1, the booster material layer 22 may be conformally deposited on the surfaces of the lower electrodes 20, the supporters 16S and 18S, and the etch stop layer 14. In Comparative Example 1, subsequent selective etching may be omitted.

In Comparative Example 2, the booster material layer 22 may be omitted. In Comparative Example 2, the dielectric layer 23 may be directly deposited on the surfaces of the lower electrodes 20, the supporters 16S and 18S, and the etch stop layer 14.

The selective deposition of the booster material layer 22 may reduce the effective oxide thickness to a level equivalent to that of the non-selective deposition of the booster material layer 22, and may also reduce the disturbance defect. In addition, the disturbance defect may be further reduced by subsequent selective etching.

By sequentially performing the selective deposition and selective etching of the booster material layer 22, the disturbance defect may be further reduced compared to Comparative Example 1 in which only the selective deposition of the booster material layer is performed.

By sequentially performing the selective deposition and selective etching of the booster material layer 22, the disturbance defect may be reduced as much as reduced in Comparative Example 2, and the effective oxide thickness may be further reduced compared to Comparative Example 2.

Figure 4:
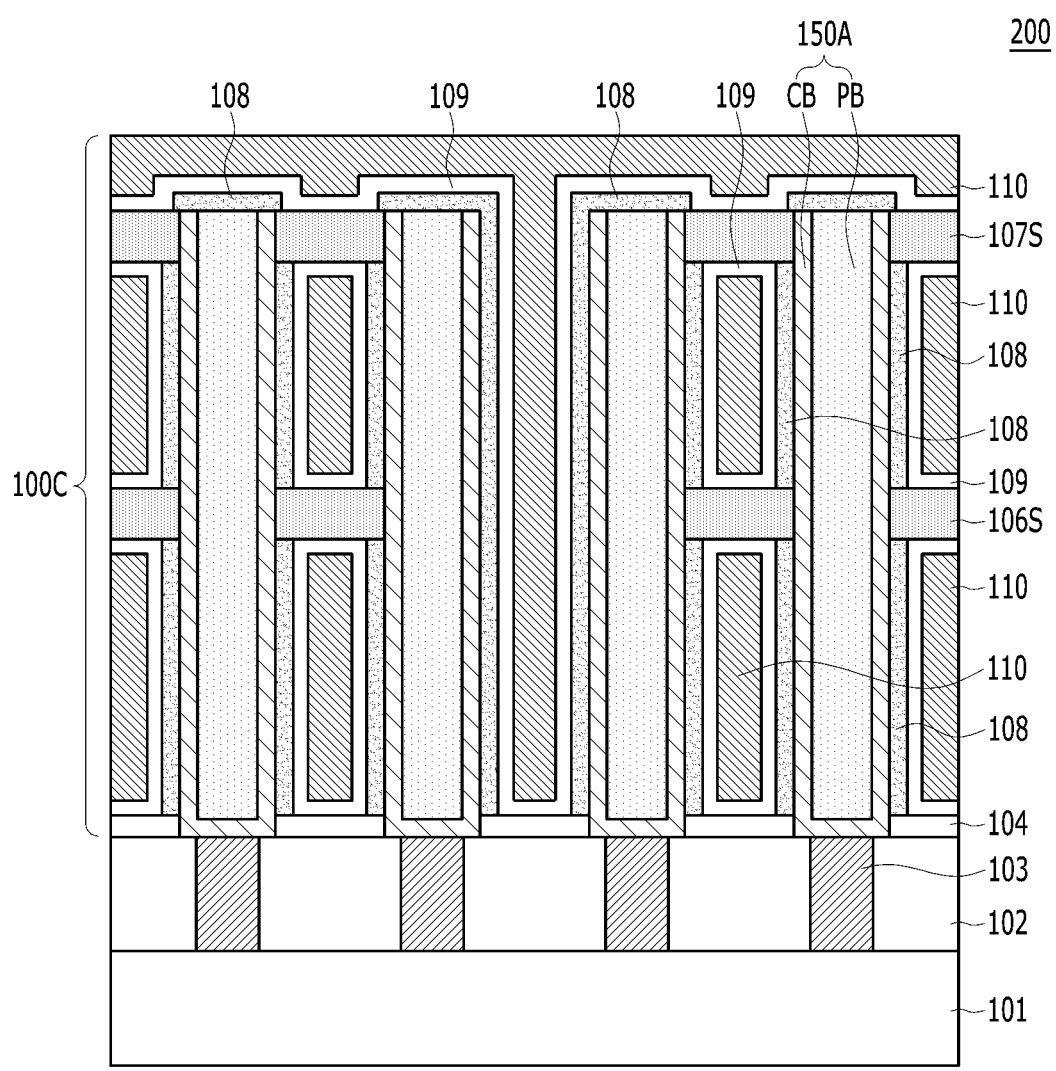
FIGS. 4 to 8 are diagrams illustrating semiconductor devices according to other embodiments of the present invention.

FIG. 4 is a diagram illustrating a semiconductor device according to another embodiment of the present invention. The semiconductor device of FIG. 4 may be similar to the semiconductor device of FIG. 1.

Referring to FIG. 4, the semiconductor device 200 may include a capacitor structure 100C. The capacitor structure 100C may include a plurality of lower electrodes 150A, supporters 106S and 107S supporting the lower electrodes 150A, a dielectric layer 109 formed on the supporters 106S and 107S and the lower electrodes 150A, and an upper electrode 110 formed on the dielectric layer 109. The capacitor structure 100C may further include a booster layer 108 formed between the lower electrodes 150A and the dielectric layer 109. Each of the lower electrodes 150A may be electrically connected to the substrate 101 through a corresponding contact plug 103. The contact plugs 103 may be connected to the substrate 101 by passing through the interlayer insulating layer 102 on the substrate 101. The contact plugs 103 may be referred to also as storage node contact plugs.

The lower electrodes 150A may include polysilicon, a metal, metal nitride, conductive metal oxide, metal silicide, noble metal, or a combination thereof. The lower electrodes 150A may include at least one selected from the group consisting of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof.

The lower electrodes 150A of FIG. 4 have a hybrid shape, and may include a cylindrical electrode CB and a pillar-shaped electrode PB filling the inside of the cylinder of the cylindrical electrode CB.

In the present embodiment, the cylindrical electrode CB may be titanium nitride, and the pillar-shaped electrode PB may be polysilicon.

The booster layer 108 may be disposed on sidewalls and top surfaces of the lower electrodes 150A. The booster layer 108 may be disposed between the lower electrodes 150A and the dielectric layer 109, and may not be formed between the dielectric layer 109 and the supporters 106S and 107S. The booster layer 108 may be selectively formed on the surface of the cylindrical electrode CB, and may be selectively formed on the upper surface of the pillar-shaped electrode PB.

Figure 5:
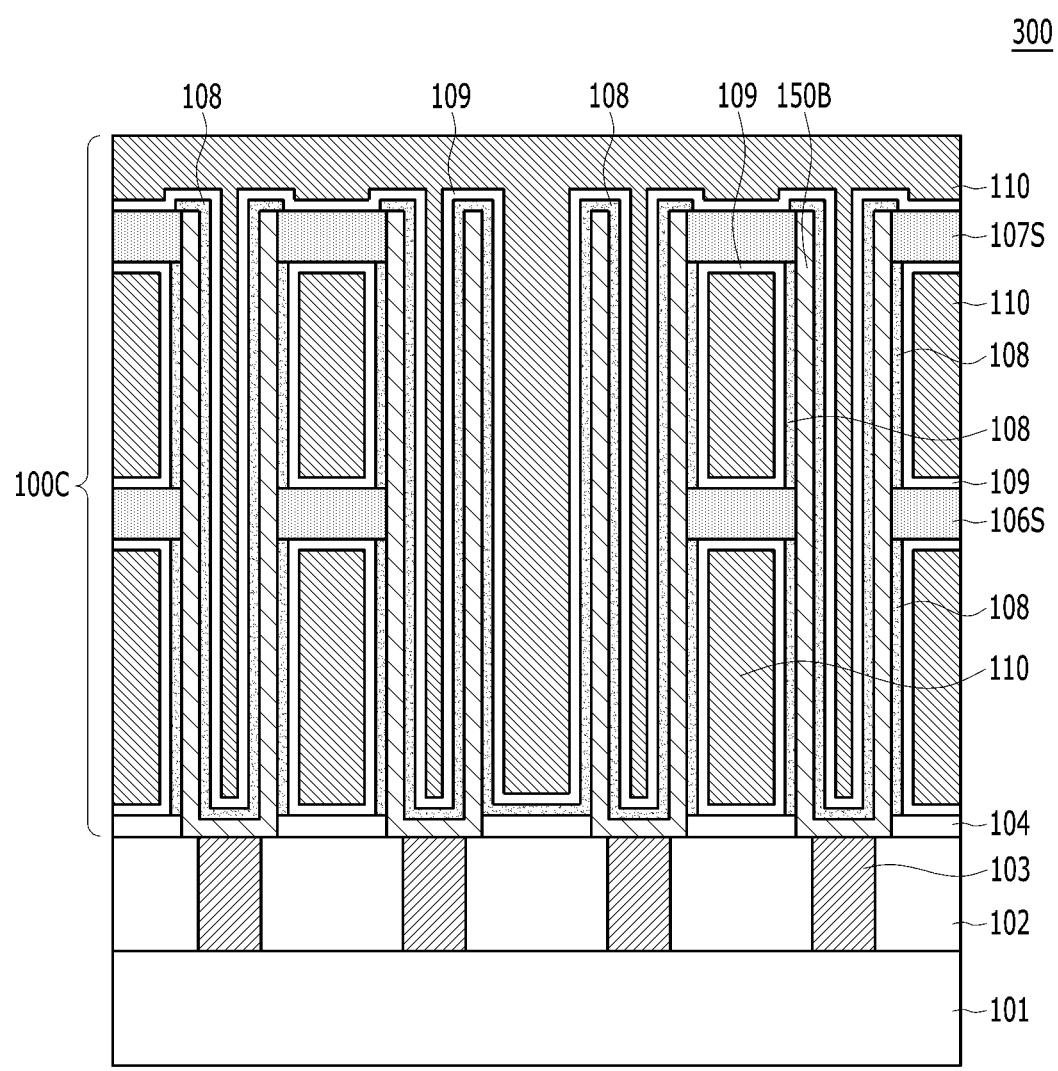

FIG. 5 is a diagram illustrating a semiconductor device according to another embodiment of the present invention. The semiconductor device of FIG. 5 may be similar to the semiconductor device of FIG. 1.

Referring to FIG. 5, the semiconductor device 300 may include a capacitor structure 100C. The capacitor structure 100C may include a plurality of lower electrodes 150B, supporters 106S and 107S supporting the lower electrodes 150B, a dielectric layer 109 formed on the supporters 106S and 107S and the lower electrodes 150B, and an upper electrode 110 formed on the dielectric layer 109. The capacitor structure 100C may further include a booster layer 108 formed between the lower electrodes 150B and the dielectric layer 109. Each of the lower electrodes 150B may be electrically connected to the substrate 101 through a corresponding contact plug 103. The contact plugs 103 may be connected to the substrate 101 by passing through the interlayer insulating layer 102 formed on the substrate 101. The contact plugs 103 may be referred to also as storage node contact plugs. The lower electrodes 150B may include polysilicon, a metal, metal nitride, conductive metal oxide, metal silicide, a noble metal, or a combination thereof. The lower electrodes 150B may include at least one selected from the group consisting of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof.

The lower electrodes 150B of FIG. 5 may have, for example, a cylindrical shape. The lower electrodes 150B may include, for example, titanium nitride. The booster layer 108 may be selectively formed on the inner and outer walls of the cylinders of the lower electrodes 150B. The booster layer 108 may be disposed between the lower electrodes 150B and the dielectric layer 109. The booster layer 108 may not be formed either between the dielectric layer 109 and the lower-level supporter 106S and between the dielectric layer 109 and the upper-level supporter 107S.

Figure 6:
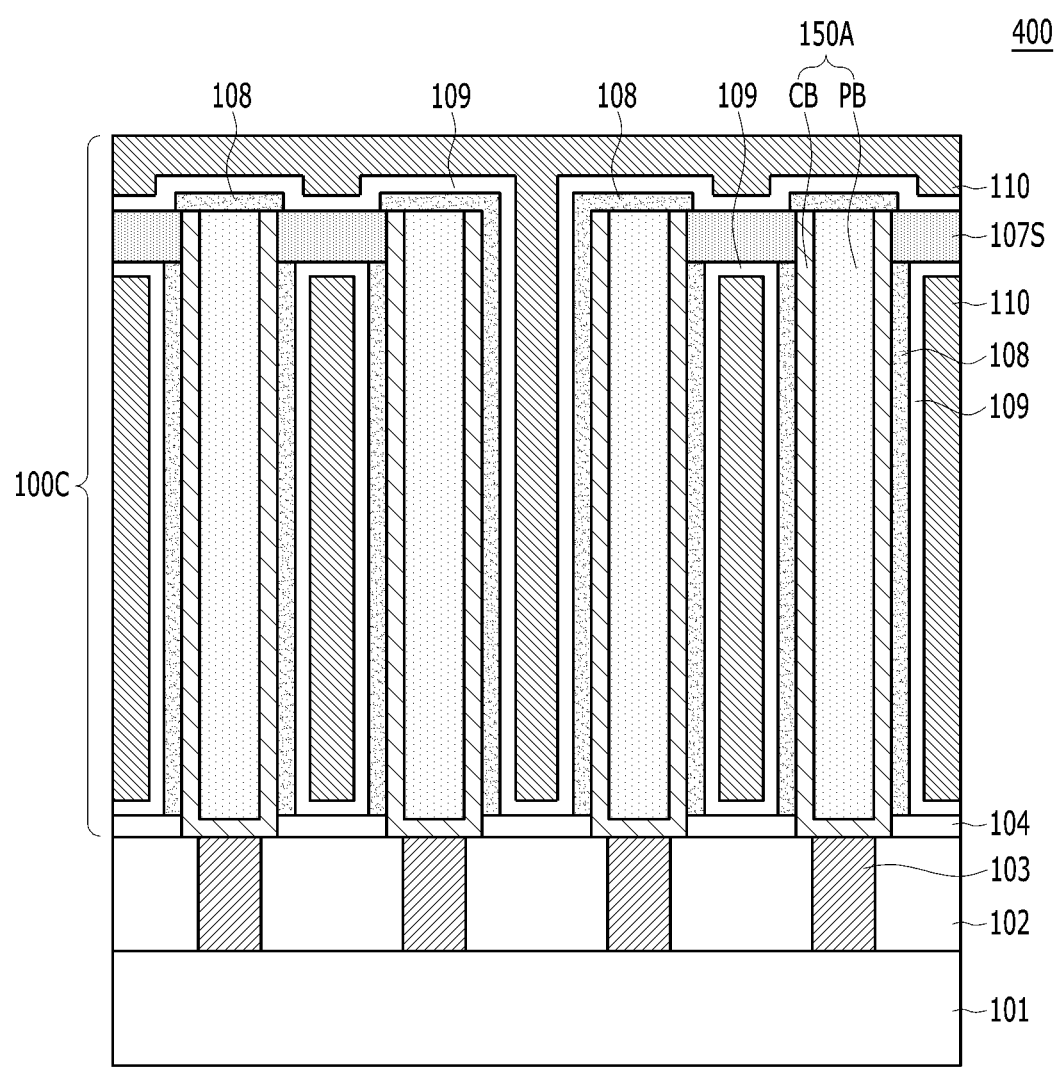

FIG. 6 is a diagram illustrating a semiconductor device according to another embodiment of the present invention. The semiconductor device of FIG. 6 may be similar to the semiconductor devices of FIGS. 1 and 4.

Referring to FIG. 6, the semiconductor device 400 may include a capacitor structure 100C. The capacitor structure 100C may include a plurality of lower electrodes 150A, a single supporter 107S supporting the lower electrodes 150A, a dielectric layer 109 formed on the lower electrodes 150A and the single supporter 107S, and an upper electrode 110 formed on the dielectric layer 109. The capacitor structure 100C may further include a booster layer 108 formed between the lower electrodes 150A and the dielectric layer 109. Each of the lower electrodes 150A may be electrically connected to the substrate 101 through a corresponding contact plug 103. The contact plugs 103 may be connected to the substrate 101 by passing through the interlayer insulating layer 102 formed on the substrate 101. The contact plugs 103 may be referred to also as storage node contact plugs.

The lower electrodes 150A may include polysilicon, a metal, metal nitride, conductive metal oxide, metal silicide, noble metal, or a combination thereof. The lower electrodes 150A may include at least one selected from the group consisting of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof.

The lower electrodes 150A of FIG. 6 have a hybrid shape, and may include a cylindrical electrode CB and a pillar-shaped electrode PB filling the inside of the cylinder of the cylindrical electrode CB. In the present embodiment, the cylindrical electrode CB may be titanium nitride, and the pillar-shaped electrode PB may be polysilicon.

The booster layer 108 may be disposed on sidewalls and top surfaces of the lower electrodes 150A. The booster layer 108 may be formed between the lower electrodes 150A and the dielectric layer 109, and may not be formed between the dielectric layer 109 and the single supporter 107S. The booster layer 108 may be selectively formed on the surface of the cylindrical electrode CB, and may be selectively formed on the upper surface of the pillar-shaped electrode PB.

Figure 7:
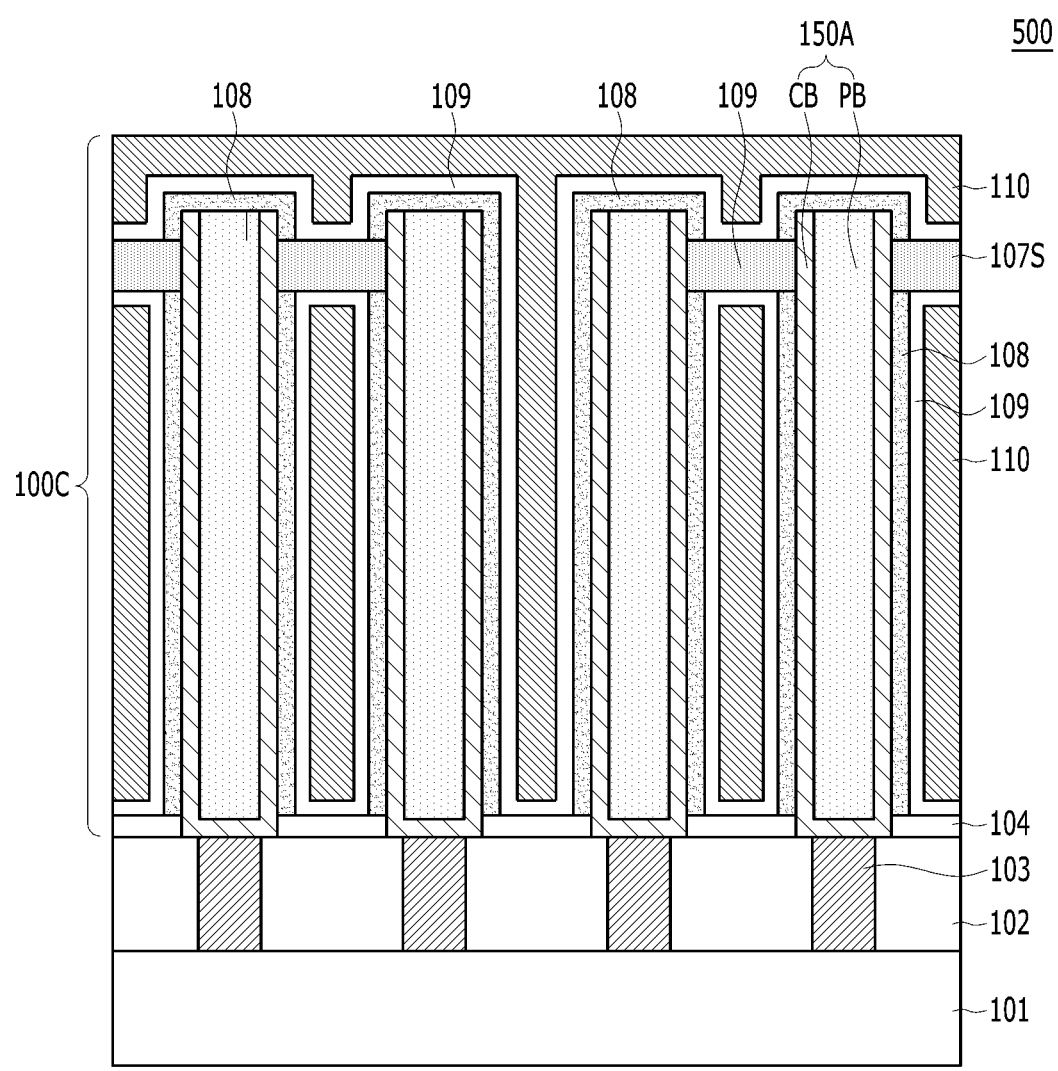

FIG. 7 is a diagram illustrating a semiconductor device according to another embodiment of the present invention. The semiconductor device of FIG. 7 may be similar to the semiconductor device of FIG. 6.

Referring to FIG. 7, the semiconductor device 500 may include a capacitor structure 100C. The capacitor structure 100C may include a plurality of lower electrodes 150A, a single supporter 107S supporting the lower electrodes 105, a dielectric layer 109 formed on the lower electrodes 150A and the single supporter 107S, and an upper electrode 110 formed on the dielectric layer 109. The capacitor structure 100C may further include a booster layer 108 formed between the lower electrodes 150A and the dielectric layer 109. Each of the lower electrodes 150A may be electrically connected to the substrate 101 through a corresponding contact plug 103. The contact plugs 103 may be connected to the substrate 101 by passing through the interlayer insulating layer 102. The contact plugs 103 may be referred to also as storage node contact plugs.

The lower electrodes 150A may include polysilicon, a metal, metal nitride, metal silicon nitride, conductive metal oxide, metal silicide, a noble metal, or a combination thereof. The lower electrodes 150A may include at least one selected from the group consisting of titanium (Ti), titanium nitride (TiN), titanium silicon nitride (TiSiN), tantalum (Ta), tantalum nitride (TaN), titanium aluminum nitride (TiAlN), tungsten (W), and tungsten nitride (WN), ruthenium (Ru), ruthenium oxide ($RuO_2$), iridium (Ir), iridium oxide ($IrO_2$), platinum (Pt), molybdenum (Mo), or a combination thereof.

The lower electrodes 150A of FIG. 7 have a hybrid shape, and may include a cylindrical electrode CB and a pillar-shaped electrode PB filling the inside of the cylinder of the cylindrical electrode CB. In the present embodiment, the cylindrical electrode CB may be titanium nitride, and the pillar-shaped electrode PB may be polysilicon.

The booster layer 108 may be disposed on sidewalls and top surfaces of the lower electrodes 150A. The booster layer 108 may be formed between the lower electrodes 150A and the dielectric layer 109, and may not be formed between the dielectric layer 109 and the single supporter 107S. The booster layer 108 may be selectively formed on the surface of the cylindrical electrode CB, and may be selectively formed on the upper surface of the pillar-shaped electrode PB.

The uppermost surface of the single supporter 107S of FIG. 7 may be positioned at a lower level than the uppermost surface of the lower electrodes 150A. Top surfaces and top sidewalls of the lower electrodes 150A exposed by the single supporter 107S may be covered by the booster layer 108.

Figure 8:
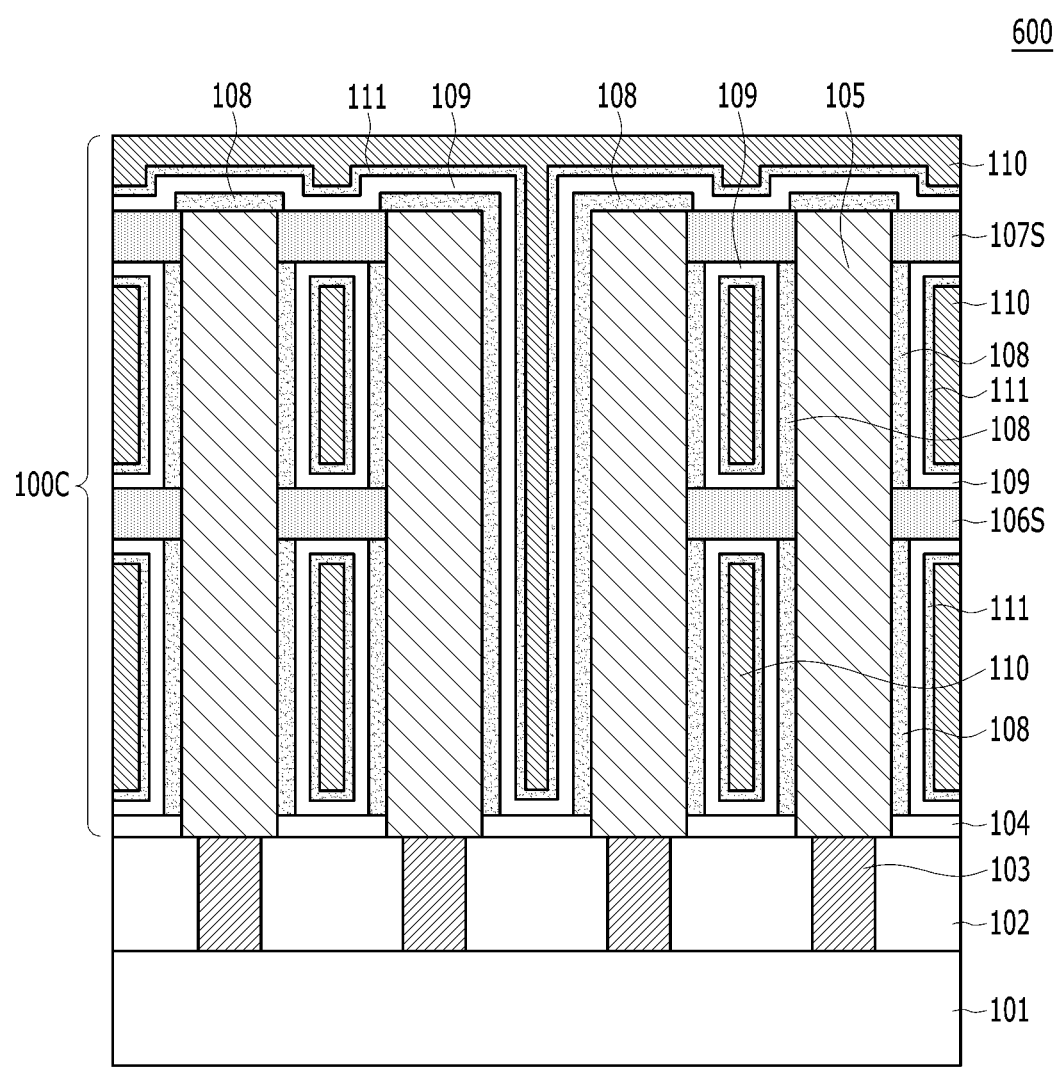

FIG. 8 is a diagram illustrating a semiconductor device according to another embodiment of the present invention. The semiconductor device of FIG. 8 may be similar to the semiconductor device of FIG. 1.

Referring to FIG. 8, the semiconductor device 600 may include a capacitor structure 100C. The capacitor structure 100C may include a plurality of lower electrodes 105, supporters 106S and 107S supporting the lower electrodes 105, a dielectric layer 109 formed on the lower electrodes 105 and the supporters 106S and 107S, and an upper electrode 110 formed on the dielectric layer 109. The capacitor structure 100C may further include a booster layer 108 formed between the lower electrodes 105 and the dielectric layer 109. Each of the lower electrodes 105 may be electrically connected to the substrate 101 through a corresponding contact plug 103. The contact plugs 103 may be connected to the substrate 101 by passing through the interlayer insulating layer 102 formed on the substrate 101. The contact plugs 103 may be referred to also as storage node contact plugs.

The capacitor structure 100C of FIG. 8 may further include an interface layer 111 formed between the upper electrode 110 and the dielectric layer 109. The interface layer 111 and the booster layer 108 may be the same material or different materials. The interface layer 111 may include niobium oxide ($Nb_2O_5$), niobium nitride (NbN), niobium oxynitride (NbON), tantalum oxide, yttrium oxide, or lanthanum oxide. In some embodiments, the interface layer 111 and the booster layer 108 may each include niobium oxide ($Nb_2O_5$), niobium nitride (NbN), or niobium oxynitride (NbON). The booster layer 108 may serve to amplify the dielectric constant of the dielectric layer 109, and the interface layer 111 may serve to suppress leakage current of the dielectric layer 109. The interface layer 111 may also serve to boost the dielectric constant of the dielectric layer 109. The interface layer 111 may be formed by atomic layer deposition as shown in FIG. 3 or by atomic layer deposition in which surface passivation material injection is omitted.

In another embodiment, the dielectric layer 109 may include a ZAZ ($ZrO_2/Al_2O_3/ZrO_2$), HAH ($HfO_2/Al_2O_3/HfO_2$) or HZAZH ($HfO_2/ZrO_2/Al_2O_3/ZrO_2/HfO_2$) stack, and a booster layer 108 and the interface layer 111 may include niobium oxide, niobium nitride, or niobium oxynitride. An NZAZN stack, an NHAHN stack, or an NHZAZHN stack including the booster layer 108, the dielectric layer 109, and the interface layer 111 may be formed between the lower electrodes 105 and the upper electrode 110. In the NZAZN stack, NHAHN stack or NHZAZHN stack, and NHZAZHN stack, N may include niobium oxide ($Nb_2O_5$), niobium nitride (NbN) or niobium oxynitride (NbON).

In the capacitor structure 100C of FIG. 8, a stack structure of the booster layer 108, the dielectric layer 109, and the interface layer 111 may be disposed between the lower electrode 105 and the upper electrode 110.

In the embodiments shown in FIGS. 4 to 8, the booster layer 108 may include niobium oxide ($Nb_2O_5$), niobium nitride (NbN), niobium oxynitride (NbON), tantalum oxide, yttrium oxide, or lanthanum oxide.

In the embodiments shown in FIGS. 4 to 8, the dielectric layer 109 may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). In another embodiment, the dielectric layer 109 may include a ZAZ ($ZrO_2/Al_2O_3/ZrO_2$) stack, a ZAZA ($ZrO_2/Al_2O_3/ZrO_2/Al_2O_3$) stack, a ZAZAT ($ZrO_2/Al_2O_3/ZrO_2/Al_2O_3/TiO_2$) stack, a HAH ($HfO_2/Al_2O_3/HfO_2$) stack, a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, a $Ta_2O_5/HfO_2/Al_2O_3/HfO_2$ stack, and a HZAZH ($HfO_2/ZrO_2/Al_2O_3/ZrO_2/HfO_2$) stack. In other embodiments, the dielectric layer 109 may include a ferroelectric material, an anti-ferroelectric material, or a combination thereof. In another embodiment, the dielectric layer 109 may include HfZrO, Hf-rich HfZrO, Zr-rich HfZrO, or a combination thereof.

In embodiments shown in FIGS. 4 to 8, the upper electrode 110 may include polysilicon, silicon germanium, metal, metal nitride, metal silicon nitride, conductive metal oxide, metal silicide, noble metal, or a combination thereof. The upper electrode 110 may include at least one selected from the group consisting of titanium (Ti), titanium nitride (TiN), titanium silicon nitride (TiSiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), molybdenum (Mo), or a combination thereof. For example, the upper electrode 110 may include a stack in which titanium nitride (TiN), silicon germanium (SiGe), and tungsten nitride (WN) are stacked in the recited order.

The present invention described above is not limited by the above-described embodiments and the accompanying drawings, and it will be apparent to those skilled in the art that various substitutions, modifications, and changes may be made without departing from the spirit and scope of the present invention.

What is claimed is:
1. A semiconductor device, comprising:
a lower electrode;
a supporter supporting an outer wall of the lower electrode;
a dielectric layer formed over the lower electrode and the supporter;
an upper electrode formed on the dielectric layer; and
a dielectric booster layer disposed between the lower electrode and the dielectric layer, and selectively formed on a surface of the lower electrode,
wherein the dielectric booster layer comprises a nitrogen-rich niobium nitride, and
wherein the dielectric booster layer is disposed only on the surface of the lower electrode except for a surface of the supporter, and
wherein the dielectric layer directly contacts the supporter and an area between the dielectric layer and the supporter is booster layer-free in which the dielectric booster layer is not disposed.

2. The semiconductor device of claim 1, wherein
the dielectric layer includes a high-k material having a tetragonal crystalline structure.

3. The semiconductor device of claim 1, wherein the lower electrode includes titanium nitride and the dielectric booster layer is selectively formed on a surface of the titanium nitride.

4. The semiconductor device of claim 1, wherein the dielectric booster layer includes tantalum oxide, yttrium oxide, or lanthanum oxide.

5. The semiconductor device of claim 1, wherein the dielectric layer includes hafnium oxide, and the hafnium oxide has a tetragonal crystalline structure.

6. The semiconductor device of claim 1, further including an interface layer formed between the dielectric layer and the upper electrode.

7. The semiconductor device of claim 6, wherein the interface layer includes niobium oxide, niobium nitride, niobium oxynitride, tantalum oxide, yttrium oxide, or lanthanum oxide.

8. The semiconductor device of claim 1, wherein the dielectric layer includes zirconium oxide, hafnium oxide, HfZrO, a ZAZ ($ZrO_2/Al_2O_3/ZrO_2$) stack, a ZAZA ($ZrO_2/Al_2O_3/ZrO_2/Al_2O_3$) stack, a ZAZAT ($ZrO_2/Al_2O_3/ZrO_2/Al_2O_3/TiO_2$) stack, a HAH ($HfO_2/Al_2O_3/HfO_2$) stack, a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, a $Ta_2O_5/HfO_2/Al_2O_3/HfO_2$ stack, or a HZAZH ($HfO_2/ZrO_2/Al_2O_3/ZrO_2/HfO_2$) stack.

9. The semiconductor device of claim 1, wherein the lower electrode includes a cylinder shape, a pillar shape, or a combination of the cylinder shape and the pillar shape.

10. A semiconductor device, comprising:
a lower electrode;
a supporter formed on an upper-level of an outer wall of the lower electrode;
a dielectric layer formed over the lower electrode and the supporter;
an upper electrode formed on the dielectric layer; and
a dielectric booster layer disposed between the lower electrode and the dielectric layer,
wherein an area between the dielectric layer and the supporter is booster layer-free in which the dielectric booster layer is not disposed.

11. The semiconductor device of claim 10, further comprising:
an etch stop layer formed on a bottom-level of the outer wall of the lower electrode.

12. The semiconductor device of claim 10, wherein two surfaces faced each other of the supporter are directly contacted to the dielectric layer.

* * * * *